United States Patent [19]
Nguyen et al.

[11] Patent Number: 5,828,608
[45] Date of Patent: Oct. 27, 1998

[54] SELECTIVELY DECOUPLED I/O LATCH

[75] Inventors: Hy V. Nguyen, San Jose; Richard C. Li, Cupertino, both of Calif.

[73] Assignee: Xilinx, Inc., San Jose, Calif.

[21] Appl. No.: 756,619

[22] Filed: Nov. 26, 1996

[51] Int. Cl.$^6$ .................................................. G11C 7/00
[52] U.S. Cl. ................................. 365/189.05; 365/154
[58] Field of Search ..................... 365/189.05, 230.08, 365/154, 233, 205

[56] References Cited

U.S. PATENT DOCUMENTS

| | | |
|---|---|---|
| 4,654,826 | 3/1987 | Yamanouchi et al. ............. 365/189.05 |
| 5,541,881 | 7/1996 | Miller .................................. 365/189.05 |
| 5,615,146 | 3/1997 | Gotou . | |

*Primary Examiner*—Tan T. Nguyen
*Attorney, Agent, or Firm*—James P. Hao; Wagner, Murabito &Hao; Jeanette S. Harms

[57] ABSTRACT

A selectively decoupled latch circuit used for latching a signal. The circuit contains an input line for accepting an input signal to the circuit. A latch is connected to the input line for latching the input signal. A transfer gate is also connected to the input line and latch for transferring the input signal to the latch according to a clock signal. A transistor is connected in a series with a feedback loop associated with the latch. The transistor selectively decouples the feedback path according to the clock signal. By selectively decoupling the feedback path, it is easier for a new input signal to become latched because contention between a prior latched signal versus the new input signal is minimized. An output line is connected to the latch for outputting a latched signal.

9 Claims, 7 Drawing Sheets

SELECTIVELY DECOUPLED I/O LATCH

FIELD OF THE INVENTION

The present invention pertains to a selectively decoupled input/output latch.

BACKGROUND OF THE INVENTION

Integrated circuit (IC) semiconductor chips are critical components found within virtually all modern electronic devices such as computers, telecommunication equipment, instrumentation, many interconnected consumer products, etc. These devices usually contain many interconnected IC chips. Each IC chip performs a different, specific task. They are interconnected so that they can communicate with each other. The signals being transmitted between the various IC chips are typically latched. When read/write operations occur, input/output (I/O) latches are used to facilitate the proper interface between the various signals that are being sent or received. Furthermore, the I/O latches provide proper timing and signal characteristics. By examining how these I/O latches are commonly used, one can appreciate the importance of their functions to the exchange of signals between various IC components.

For instance, when the microprocessor of a computer accesses specific memory locations within a memory chip, it sends memory address signals to the memory chip to designate the desired location. The memory chip has I/O latches for accepting the address signals Thereby, the received address signals are properly retained and synchronized with the internal circuits of the memory chip. Furthermore, the I/O latches ensure that the address signals have enough drive or strength to be recognized. Not only do the signals on the address lines have to be latched but also signals on the Read/Write input, Data input, and Output lines have to be latched as well. All these signals are latched, and a single external clock signal controls the I/O latches so that all the related functions are synchronized within the memory chip. Furthermore, synchronicity is also achieved between the memory and microprocessor. For these reasons, it is crucial that the I/O latches operate correctly in order to avoid errors.

A typical prior art I/O latch circuit is illustrated in FIG. 1. It includes buffer 101, buffer inverters 112–113, drivers 102–103, inverters 104–106, N-channel transistor 107, P-channel transistor 108, transfer gate 109, latch 110, and node 111. The main purpose of this I/O latch circuit is to receive an input signal and to latch that signal according to a clock signal. At each clock cycle, the I/O latch stores the state of the input signal. The process begins when an input signal enters the circuit and is allowed to pass through transfer gate 109. For the input signal to pass, the clock signal must be at a high voltage which controls the two transistors that comprise transfer gate 109. This high clock signal causes N-channel transistor 107 to be conductive. This same active clock signal is inverted by inverter 106 and causes P-channel transistor 108 to be conductive. With both transistors conducting, the input signal is allowed to pass through transfer gate 109 to latch 110. Latch 110 holds the received input signal by using inverters 104 and 105 connected in series to form a continuous feedback loop. For example, FIG. 2 shows the voltage value at node 111 at a high voltage (e.g., +5 volts). Inverter 105 converts that value into a low voltage signal (e.g., 0 volts). Inverter 104 receives that low signal and converts it into a high signal which returns back to node 111. This process continues to repeat itself until a new voltage value is received at node 111. While latch 110 holds the received input signal, driver 103 transfers that signal value to the output. At this point, the output signal is the same as the input signal received by the I/O latch.

Although this prior art I/O latch is sufficient, it does suffer several disadvantages. One problem is associated with the simulation of the typical I/O latch circuit. Simulation is a process in which electrical engineers test their integrated circuit designs to ensure that they work properly. This is a very important process because IC chips are expensive to produce and flawed chips must be thrown away. Furthermore, any changes to designs, detrimentally impacts the product's time to market. To minimize downside risks, new designs are modeled and run on a test simulator to verify whether they will perform properly. When the typical I/O latch is modeled behaviorally or structurally using a standard test simulator, the problem centers around the fact that the actual value of node 111 can not accurately be determined by the simulator. For example, FIG. 2 shows a high voltage signal entering into a conducting transfer gate 109 which transfers it to node 111. Latch 110 holds that high signal by using inverters 104 and 105 as discussed earlier. However, when the signal entering transfer gate 109 changes from a high voltage to a low voltage as seen in FIG. 3, the simulator determines that there is a contention at node 111 between the existing high signal held by latch 110 and the incoming low signal. Because of this contention, the simulator responds by issuing a State "X" at node 111. State "X" indicates that the value at node 111 could be a high voltage, low voltage, or high impedance and the simulator is undecided on the value. This ambiguous State "X" is not helpful to the simulation of complex circuits because it is difficult to ascertain whether isolated problem exists with the I/O latches or whether an altogether different problem exists with the new design.

Another problem with the typical I/O latch is associated with the actual circuit. The problem is very closely related to the modeling problem at node 111 just discussed. The problem centers around the fact that the actual circuit must be designed to overcome the voltage value stored in latch 110 at node 111. This means that whatever the voltage value is at node 111, the input signal and transfer gate 109 must have the requisite drive to cause latch 110 to transition to the desired opposite value. In order to properly transition node 111, a large driver 102 is required for the I/O latch circuit to work properly. Moreover, it is important for faster chip speeds that the I/O latch be able to switch from one voltage value to another as fast as possible. This requires increasing the size of driver 102 even further. These two factors contribute to greatly increase the size of driver 102. This, in turn, increases the size of the I/O latch circuit. Table I below shows the typical drivers, inverters and other device sizes that are required for a typical I/O latch to work properly.

TABLE I

| Device | P width ($\mu$m) | N width ($\mu$m) |
| --- | --- | --- |
| driver 102 | 40 | 20 |
| driver 103 | 40 | 20 |
| buffer inverter 112 | 10 | 5 |
| buffer inverter 113 | 20 | 10 |
| inverter 104 | 5 | 2.4 |
| inverter 105 | 5 | 2.4 |
| inverter 106 | 10 | 5 |
| N-channel transistor 107 |  | 10 |
| P-channel transistor 108 | 20 |  |

The large increase in driver size would not be much of a problem if there were only one I/O latch within an IC chip.

Unfortunately, a single chip often contains many such latches. Large latches are disadvantageous because the more I/O latches that are on an IC chip, the larger the die must be. In effect, the larger latch has a cumulative enlarging effect on the size of the die. And the larger the die size, the more expensive it is to manufacture because less dice (i.e., chips) can be fabricated from a given wafer.

Thus, there is a need for an I/O latch that does not exhibit these problems. The selectively decoupled I/O latch of the present invention solves these problems commonly associated with the typical I/O latch. The present invention controls the value of node 111 during computer modeling so that contention never occurs. This invention also eliminates the transfer gate strength requirement, which in turn, eliminates the need for buffer 101 and inverter 106. As a result, this decreases the size and increases the speed of the I/O latch circuit. These factors are constantly searched for in the IC chip industry so that the chip will be able to perform at the pinnacle of its ability.

SUMMARY OF THE INVENTION

The present invention pertains to a circuit that is used for latching input/output signals. The circuit of the present invention is comprised of a transfer gate, a latch, and a latch switch. A clock signal controls the functions of the transfer gate and the latch switch. A high clock signal value activates the transfer gate so that the input signal is applied to the latch. At the same time, the high clock signal causes the latch switch to decouple the feedback loop associated with the latch. Decoupling the feedback loop, renders it easier for the input signal to transition the state of the latch because any contention between the prior latched signal versus the incoming input signal is minimized. A low clock signal deactivates the transfer gate and restores the feedback loop associated with the latch. Restoring the feedback loop ensures that the new input signal is properly retained by the latch. In one embodiment, the input line of the circuit is connected to a driver for driving the input signal to the transfer gate. The transfer gate is comprised of an N-channel transistor coupled in series with a P-channel transistor. The output of the transfer gate is connected to the latch. The latch is comprised of two inverters that are connected in series in a feedback configuration. The latch switch is coupled as part of the inverter's feedback path. The latch switch is comprised of a P-channel transistor which is controlled by the clock signal as described above. A second driver comprising of an inverter is connected to the output of the latch for driving the latched signal to an output.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A selectively decoupled I/O latch is described. In the following description, for purposes of explanation, numerous specific details are set forth in order to provide a thorough understanding of the present invention. It will be obvious, however, to one skilled in the art that the present invention may be practiced without these specific details. In other instances, well-known structures and devices are shown in block diagram form in order to avoid obscuring the present invention.

Figure 4:
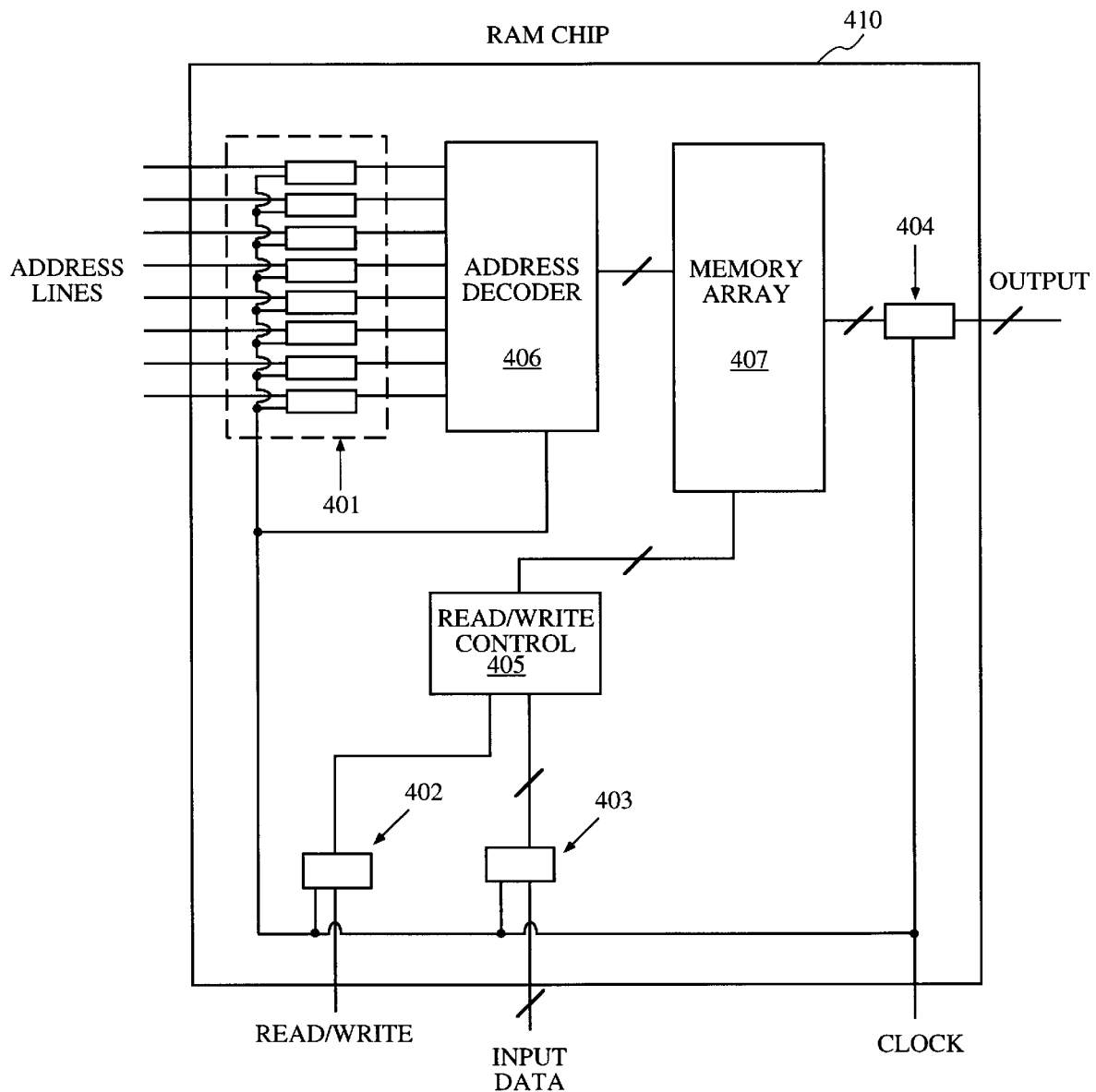
FIG. 4 illustrates a block diagram of a typical random access memory (RAM) integrated circuit chip and how the selectively decoupled I/O latch is connected within the chip.

The present invention pertains to a selectively decoupled I/O latch having minimized contention. This input/output (I/O) latch can be used in integrated circuit (IC) semiconductor chips as well as in several different IC chips. An example of its use is shown in a typical random access memory (RAM) chip illustrated in FIG. 4. RAM chip 410 includes address latches 401, read/write latch 402, input data latches 403, output latches 404, read/write control 405, address decoder 406, and memory array 407. RAM chips are commonly used to provide memory locations within computers. The RAM chips work in conjunction with the central processing unit (CPU, not shown) by providing memory locations needed for the CPU to properly perform within a computer. When the CPU wants to read from or write to the RAM-chip, it uses the address lines, read/write line, input data lines, and the output lines shown in FIG. 4. The input and output lines of a RAM chip use I/O latches to improve the proper interface between the various signals that are being sent or received by it. Furthermore, I/O latches provide proper timing and signal characteristics within the RAM chip. The present invention may be used within this type of IC semiconductor chip. By examining how a CPU and a RAM chip perform read and write operations, a greater understanding will be gained of how the present invention would operate within the RAM chip.

While performing a read operation of a specific memory location, the CPU simultaneously sends address signals and a read signal to the RAM chip. These signal are received by address latches 401 and read/write latch 402. These latches only receive the signals if the external clock signal that controls them is a high signal (e.g., +5 volts). Once the sent signals are received by these latching circuits and the clock signal cycles low, these latches hold the signals constant. The address location signals are transferred by address latches 401 to address decoder 406 while the read signal is transferred by read/write latches 402 to read/write control 405. Address decoder 406 translates the received address location into row and column signals that activates the specific memory location within memory array 407. Read/write control 405 issues a read signal to memory array 407. Once the read signal and the row and column signals are received by memory array 407, the data stored at the specified memory location is transferred to output latches 404. Output latches 404 only receive the output data while the external clock signal is high. Once the signals are within output latches 404 and the clock signal cycles low, output latches 404 hold the data constant. Output latches 404 then transfer the latched data to the CPU which completes the read operation.

While performing a write operation to a specific memory location, the CPU simultaneously sends address signals, a write signal, and input data signals to the RAM chip. These signals are received by address latches 401, read/write latch 402, and input data latches 403. These latches only receive the signals if the external clock signal that controls them is at a high signal (e.g., +5 volts). Once the sent signals are received by the latching circuits and the clock signal cycles low (e.g., 0 volts), the latches hold the signals constant. Address latches 401 then transfer address location signals to address decoder 406. At the same time, read/write control 405 receives the write signal and the input data signals transferred by read/write latch 402 and input data latches 403. Address decoder 406 translates the received address location into row and column signals that activate the specific memory location within memory array 407 that will store the input data. Read/write control 405 issues the write signal to memory array 407 and then transfers the input data to it. Once the write signal, row and column signals, and input data are received by memory array 407, the input data is stored at the specified memory location. Any pre-existing data stored at that specific memory location is written over by the newly stored data. Once the data is stored, the write operation is complete.

Figure 5:
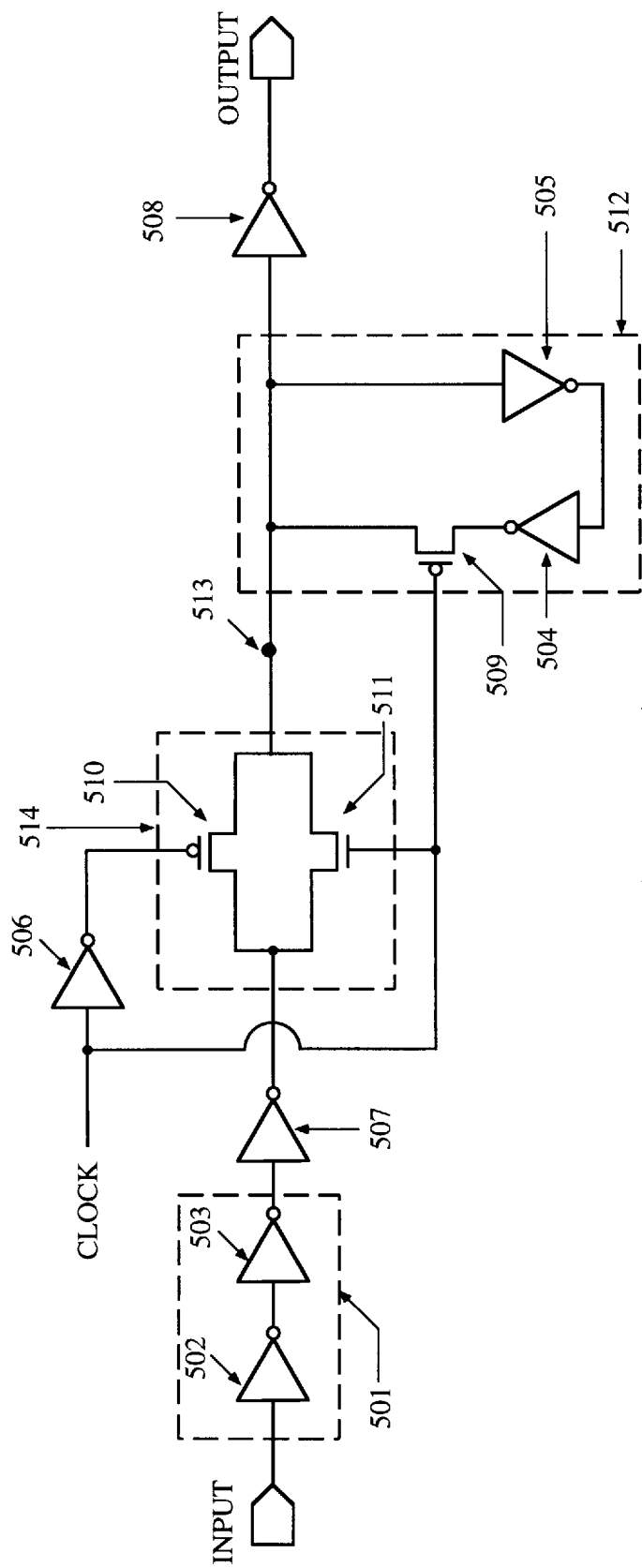
FIG. 5 illustrates a circuit diagram of the currently preferred embodiment of the selectively decoupled I/O latch.

FIG. 5 shows the currently preferred embodiment of the selectively decoupled I/O latch which includes buffer 501, buffer inverters 502–503, inverters 504–506, drivers 507–508, P-channel transistors 509–510, N-channel transistor 511, latch 512, node 513, transfer gate 514. An input signal enters the selectively decoupled I/O latch at buffer 501 comprising inverters 502–503 connected in series. Buffer 501 transfers the input signal to driver 507 also comprising an inverter. Driver 507 transfers the signal to transfer gate 514 comprising N-channel transistor 511 and P-channel transistors 510. For the input signal to pass through transfer gate 514, the clock signal that controls it must be high (e.g., +5 volts). Otherwise, transfer gate 514 is non-conductive. With the clock signal high, N-channel transistor 511 is conductive. This same active clock signal is inverted by inverter 506 and causes P-channel transistor 510 to also be conductive. With both transistors conducting, the input signal passes through transfer gate 514 to node 513 and latch 512. Latch 512 is comprised of inverters 504–505 that are connected in series in a feedback configuration. A latch switch, P-channel transistor 509, is coupled as part of the inverter's feedback path. Transfer gate 514 and latch 512 are controlled by the same clock signal. The high clock signal that causes transfer gate 514 to be conductive also causes latch 512 to be a non-conductive circuit loop. P-channel transistor 509 acts like an on/off switch for latch 512. Thereby, when the input signal reaches node 513, latch 512 is at 0 volts. But when the clock signal cycles low, P-channel transistor 509 becomes conductive and activates latch 512 to hold the input signal constant at node 513. This same low clock signal will cause transfer gate 514 to be non-conductive. Driver 508 is comprised of a inverter that transfers the input signal held by latch 512 to the output. This completes the function of the selectively decoupled I/O latch.

The following several examples illustrate more fully how the selectively decoupled I/O latch circuit in FIG. 5 operates. The first example has the initial conditions of the clock signal low and the input signal either high or low. Transfer gate 514 is non-conductive because the low clock signal deactivates N-channel transistor 511 causing it to be non-conductive. That same low clock signal passes through inverter 506 resulting in a high signal that causes P-channel transistor 510 to also be non-conductive. Thereby, when an input signal (either high or low) reaches transfer gate 514, it can not proceed any further. But once the clock signal cycles high, transfer gate 514 becomes conductive and transfers the input signal to node 513.

The next examples follow two different input signals through the entire circuit of the present invention when the clock signal is initially high. A high input signal enters the input of the circuit. Buffer inverter 502 receives the high signal and converts it to a low signal. Buffer inverter 503 receives the low signal and converts it to a high signal. Driver 507 receives the high signal and converts it to a low signal. Driver 507 transfers the low signal to transfer gate 514. With the clock signal high, transfer gate 514 is conductive and transfers the low input signal to node 513. This same high clock signal causes P-channel transistor 509 to be non-conductive which causes latch 512 to be inoperative. With the low signal at node 513, the clock signal then cycles low which causes transfer gate 514 to be non-conductive and activates latch 512 by causing P-channel transistor 509 to be conductive. With latch 512 activated, inverter 505 receives the low signal at node 513 and converts it to a high signal. Inverter 504 receives the high signal and converts it to a low signal. P-channel transistor 509 transfers the low signal to node 513. Latch 512 continues this feedback loop in this fashion until the clock signal cycles high and causes P-channel transistor 509 to be non-conductive. But before the clock signal cycles high, driver 508 receives the latched low signal and converts it to a high signal. Driver 508 then transfers the high signal to the output. Therefore, the high input signal produces a high output signal which is exactly the purpose of an I/O latch.

The next example follows a low input signal through the present invention. A low input signal enters the input of the circuit. Buffer inverter 502 receives the low signal and converts it to a high signal. Buffer inverter 503 receives the high signal and converts it to a low signal. Driver 507 receives the low signal and converts it to a high signal. Driver 507 transfers the high signal to transfer gate 514. With the clock signal high, transfer gate 514 is conductive and transfers the high input signal to node 513. This same high clock signal causes P-channel transistor 509 to be non-conductive which causes latch 512 to be inoperative. With the high signal at node 513, the clock signal then cycles low which causes transfer gate 514 to be non-conductive and activates latch 512 by causing P-channel transistor 509 to be conductive. With latch 512 activated, inverter 505 receives the high signal at node 513 and converts it to a low signal. Inverter 504 receives the low signal and converts it to a high signal. P-channel transistor 509 transfers the high signal to node 513. Latch 512 continues this feedback loop in this fashion until the clock signal cycles high and causes P-channel transistor 509 to be non-conductive. But before the clock signal cycles high, driver 508 receives the latched high signal and converts it to a low signal. Driver 508 then transfers the low signal to the output. Therefore, the low input signal produces a low output signal which is exactly the purpose of an I/O latch.

It is important to compare the prior art device sizes shown in Table I with the present invention device sizes shown in Table II. Notice the large difference in size between drivers 507–508 and drivers 102–103. The drivers of the prior art are four times larger than those of the present invention. Likewise, the buffer inverters 112–113 of the prior art are twice as large as buffer inverters 502–503 of the present invention.

TABLE II

| Device | P width (μm) | N width (μm) |
| --- | --- | --- |
| driver 507 | 10 | 5 |
| driver 508 | 10 | 5 |
| buffer inverter 502 | 5 | 2.5 |
| buffer inverter 503 | 10 | 5 |
| inverter 504 | 5 | 2.4 |
| inverter 505 | 5 | 2.4 |
| inverter 506 | 10 | 5 |
| P-channel transistor 509 | 5 | |
| p-channel transistor 510 | 20 | |
| N-channel transistor 511 | | 10 |

The decrease in device sizes of the present invention can all be attributed to the addition of P-channel transistor 509 to latch 512. P-channel transistor 509 acts as a timed on/off switch that causes latch 512 to be non-conductive and inoperative when the clock signal is high. As a result of inoperative latch 512, node 513 has zero volts which results in a non-existent voltage contention when an input signal passes through transfer gate 514 to node 513. One advantage of the non-existent voltage contention at node 513 is that circuit simulations of the selectively decoupled I/O latch will be more accurate and not result in a State "X" being issued. Another advantage of the non-existent voltage contention is that the large driver sizes can be reduced because the need to overpower node 513 does not exist anymore. With the reduction of driver sizes, the buffer inverter sizes can also be reduced. The reduction in device sizes results in the selectively decoupled I/O latch requiring less space on a die. The smaller the die, the less expensive it is to manufacture because more dice (i.e., chips) can be fabricated from a given wafer.

Figure 6:
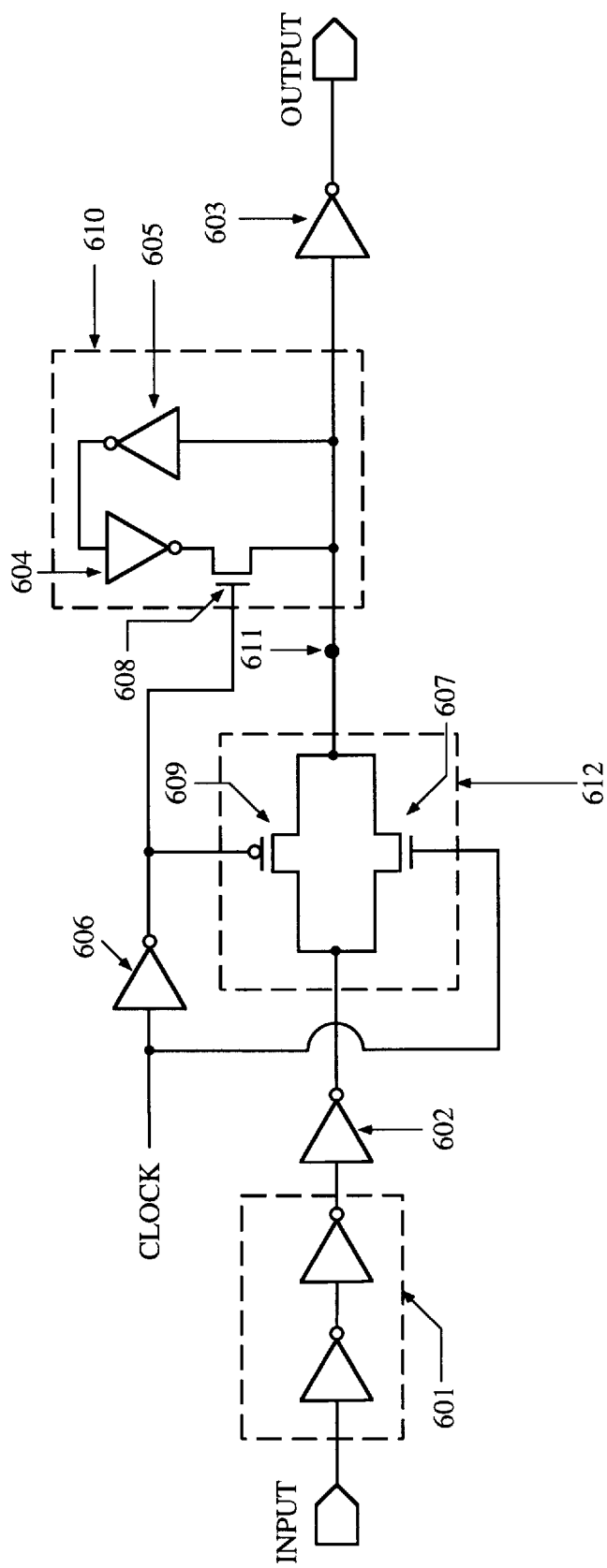
FIG. 6 illustrates a circuit diagram of an alternative embodiment of the selectively decoupled I/O latch.

FIG. 6 shows an alternative embodiment of the present invention. This embodiment includes buffer 601, drivers 602–603, inverters 604–606, N-channel transistor 607–608, P-channel transistors 609, latch 610, node 611, and transfer gate 612. FIG. 6 shows that N-channel transistor 608 can substitute for P-channel transistor 509 of FIG. 5. For this substitution to work properly, N-channel transistor 608 must be connected to the inverted clock signal of inverter 606. Everything else in FIG. 6 operates exactly the same as FIG. 5 discussed above.

Figure 7:
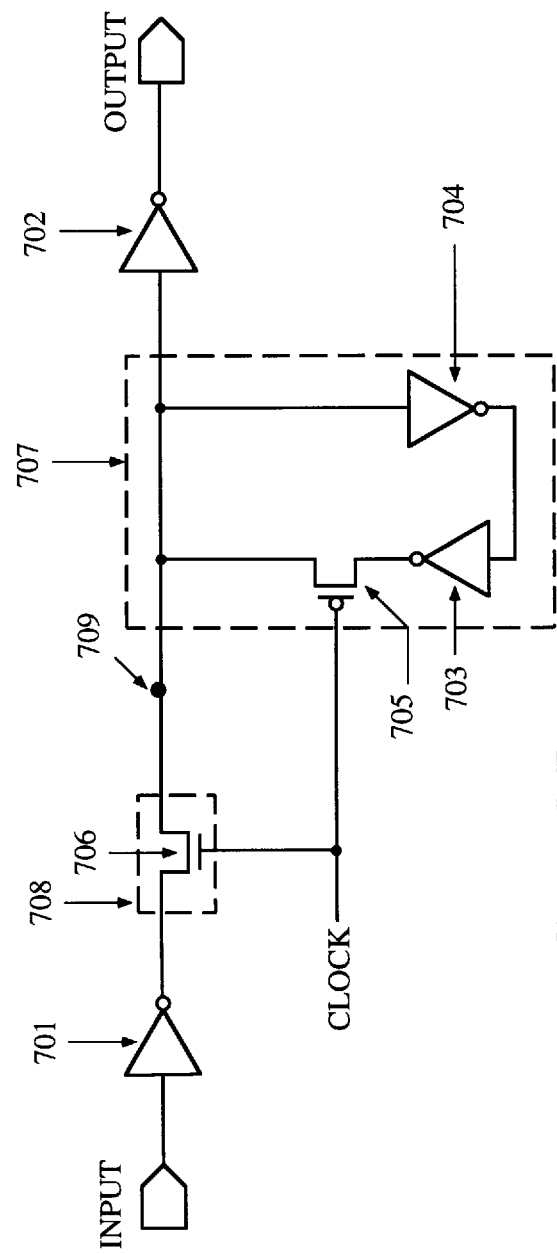
FIG. 7 illustrates a circuit diagram of a minimized alternative embodiment of the selectively decoupled I/O latch.

FIG. 7 shows an alternative embodiment of the selectively decoupled I/O latch which includes drivers 701–702, inverters 703–704, P-channel transistor 705, N-channel transistor 706, latch 707, transfer gate 708, and node 709. An input signal enters the circuit at driver 701 which is comprised of an inverter. Driver 701 transfers the signal to transfer gate 708 which is comprised of N-channel transistor 706. For the input signal to pass through transfer gate 708, the clock signal which controls it must be high (e.g., +5 volts). Otherwise, transfer gate 708 is non-conductive. With the clock signal high, N-channel transistor 706 is conductive and transfers the input signal to node 709 and latch 707. Latch 707 is comprised of inverters 703–704 that are connected in series in a feedback configuration. A latch switch, P-channel transistor 705, is coupled as part of the inverter's feedback path. Transfer gate 708 and latch 707 are controlled by the same clock signal. The high clock signal that causes transfer gate 708 to be conductive also causes latch 707 to be a non-conductive feedback loop. Latch 707 becomes a non-conductive feedback loop because P-channel transistor 705 acts like an on/off switch for latch 707. So when the input signal reaches node 709, latch 707 contains no voltage. But when the clock signal cycles low, P-channel transistor 705 is conductive and activates latch 707 to hold the input signal at node 709. This same low clock signal causes transfer gate 708 to be non-conductive. Driver 702 is comprised of an inverter that transfers the input signal held by latch 707 to the output.

Figure 1:
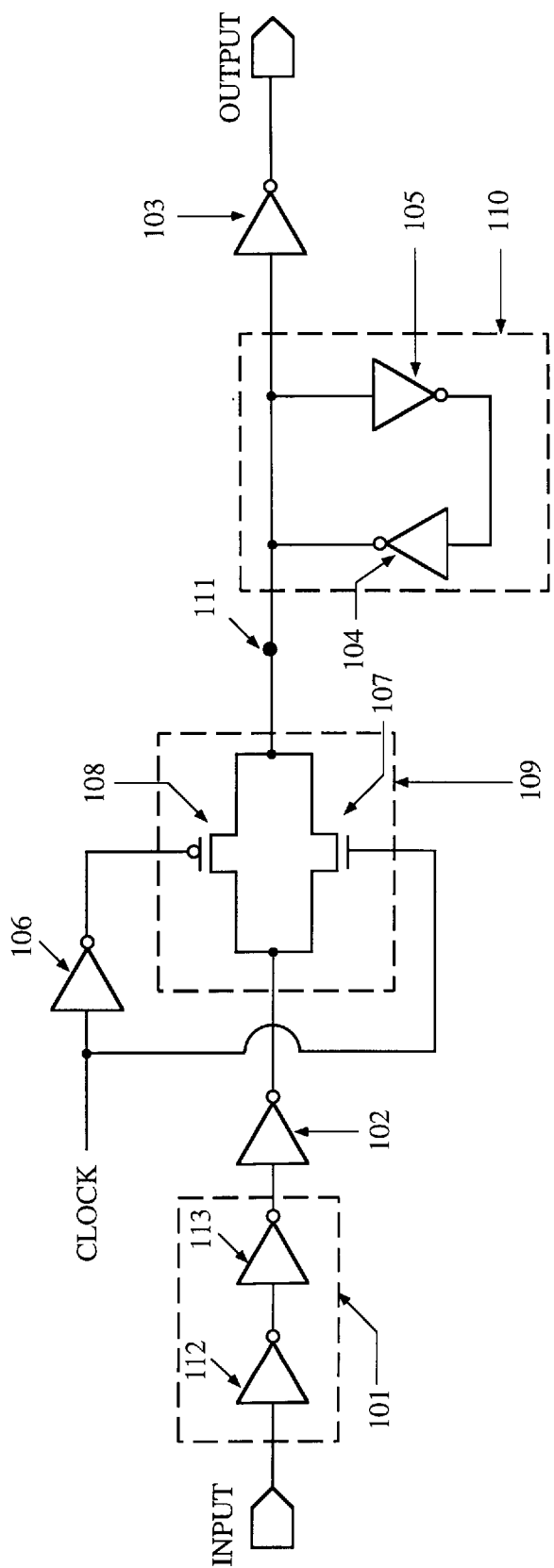
FIG. 1 illustrates a circuit diagram of a prior art input/output (I/O) latch.
Figure 2:
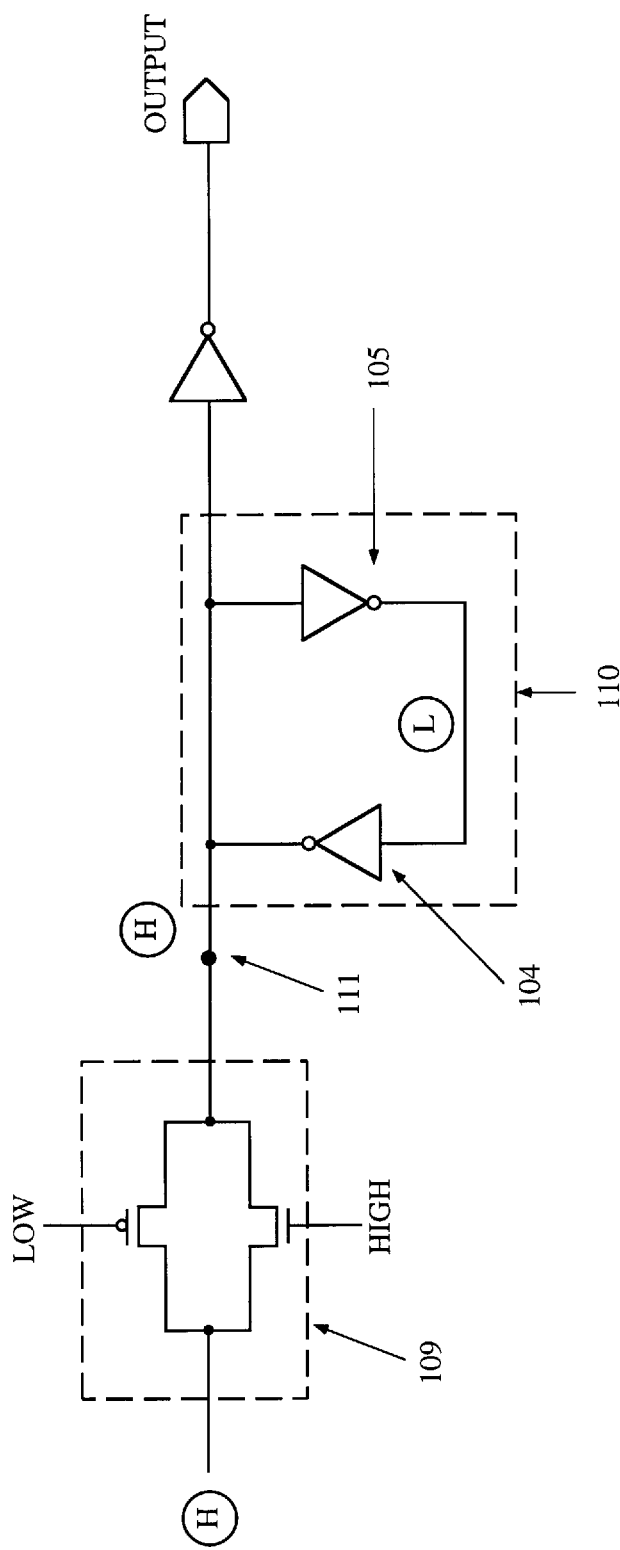
FIG. 2 shows a prior art I/O latch with voltage signals applied to the circuit and the results of those signals.
Figure 3:
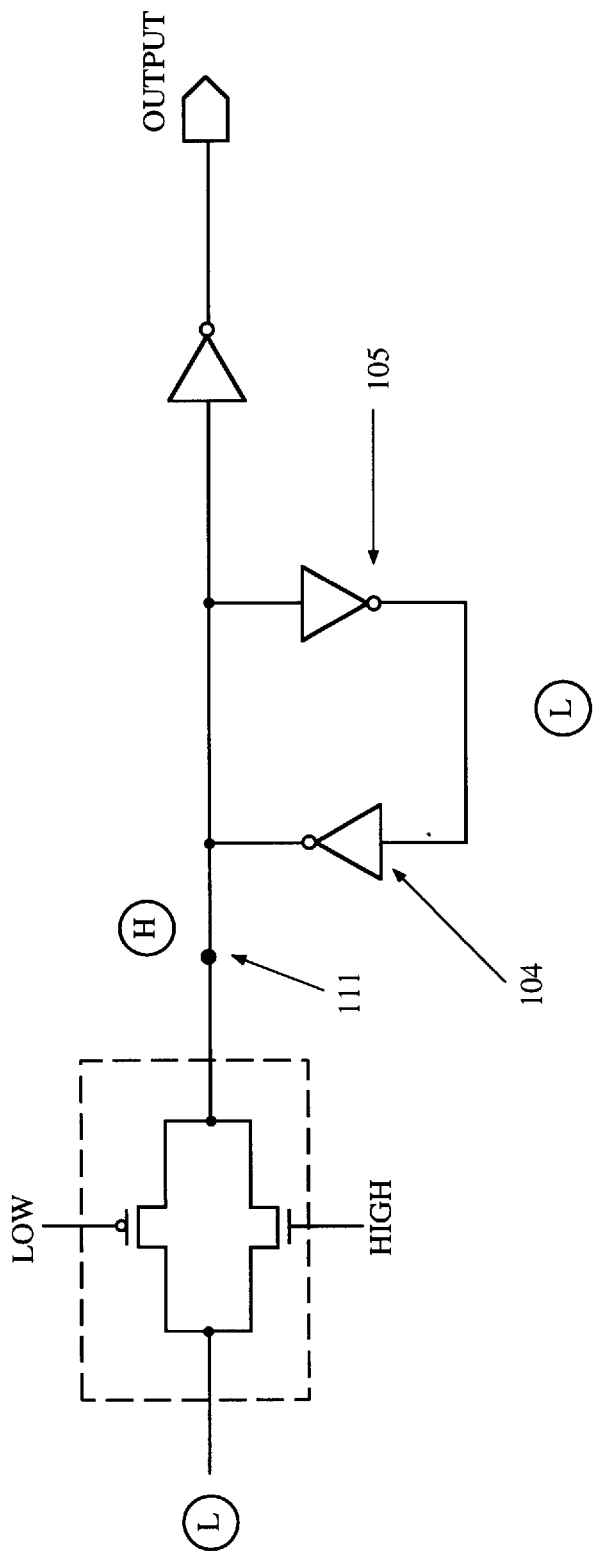
FIG. 3 shows a prior art I/O latch with different voltage signals applied to the circuit and the results of those signals.

As discussed earlier, the advantages of the selectively decoupled I/O latch centers around the addition of P-channel transistor 705 to latch 707. With the addition of P-channel transistor 705, signal contention at node 709 becomes non-existent which results in more accurate results when the selectively decoupled I/O latch is modeled by a simulator. The full effect of the addition of P-channel transistor 705 is demonstrated in the reduced circuitry of the selectively decoupled I/O latch that FIG. 7 shows. P-channel transistor 705 allows the reduction of the prior art transfer gate 109 of FIG. 1 down to a signal transistor, N-channel transistor 706. The addition of P-channel transistor 705 also allows the elimination of buffer 101 and inverter 106. Therefore, FIG. 7 has six components compared to the ten components the prior art contains in FIG. 1 which will result in the selectively decoupled I/O latch circuit becoming smaller than the prior art.

Along with the decrease in the number of components of FIG. 7, the component sizes of FIG. 7, shown in Table III, are the same reduced sizes as the component sizes of FIG. 5, shown in Table II. This results in the selectively decoupled I/O latch circuit of FIG. 7 decreasing in size even further. Therefore, the selectively decoupled I/O latch of FIG. 7 is smaller than the circuits shown in FIGS. 5 and 6 because it contains fewer components than either. Furthermore, the selectively decoupled I/O latch circuit of FIG. 7 is much smaller than the prior art circuit shown in FIG. 1 because it contains fewer and smaller components.

TABLE III

| Device | P width (μm) | N width (μm) |
| --- | --- | --- |
| driver 701 | 10 | 5 |
| driver 702 | 10 | 5 |
| inverter 703 | 5 | 2.4 |
| inverter 704 | 5 | 2.4 |
| P-channel transistor 705 | 5 | |
| N-channel transistor 706 | | 10 |

Another advantage is gained by the present invention. By eliminating the buffers of FIGS. 1, 5, and 6, the present invention in FIG. 7 is also faster than these circuits. This increase in speed is caused by the elimination of an input signal delay that results from the existence of a buffer. The more devices that the input signal must travel through, the longer it takes to get to transfer gate 708 of the selectively decoupled I/O latch circuitry. By eliminating the buffer, the faster the input signal reaches transfer gate 708.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A circuit for latching a signal, comprising:
an input line for accepting an input signal to the circuit;
a latch coupled to the input line for latching the input signal;
a transfer gate coupled to the input line and latch for transferring the input signal to the latch according to a clock signal, wherein the transfer gate is comprised of an N-channel transistor with a width of 10 µm;
a transistor coupled to the latch for decoupling a feedback path associated with the latch according to the clock signal; and
an output line coupled to the latch for providing a latched signal.

2. A circuit for latching a signal, comprising:
an input line for accepting an input signal to the circuit;
a latch coupled to the input line for latching the input signal;
a transfer rate coupled to the input line and latch for transferring the input signal to the latch according to a clock signal, wherein the transfer gate is comprised of an N-channel transistor with a width of 10 µm coupled in parallel with a P-channel transistor with a width of 20 µm;
a transistor coupled to the latch for decoupling a feedback path associated with the latch according to the clock signal; and
an output line coupled to the latch for providing a latched signal.

3. A circuit for latching a signal, comprising:
an input line for accepting an input signal to the circuit;
a latch coupled to the input line for latching the input signal;
a transfer gate coupled to the input line and latch for transferring the input signal to the latch according to a clock signal;
a transistor coupled to the latch for decoupling a feedback path associated with the latch according to the clock signal; and
wherein the transistor is comprised of a P-channel transistor with a width of 5 µm;
an output line coupled to the latch for providing a latched signal.

4. A circuit for latching a signal, comprising:
an input line for accenting an input signal to the circuit;
a latch coupled to the input line for latching the input signal;
a transfer gate coupled to the input line and latch for transferring the input signal to the latch according to a clock signal;
an output line coupled to the latch for providing a latched signal;
a first driver coupled to the input line that drives the input signal to the transfer gate, wherein the first driver is comprised of a P-channel inverter with a width of 10 µm;
a second driver coupled to the latch that drives a latched signal to the output line.

5. A circuit for latching a signal, comprising:
an input line for accepting an input signal to the circuit;
a latch coupled to the input line for latching the input signal;
a transfer gate coupled to the input line and latch for transferring the input signal to the latch according to a clock signal;
an output line coupled to the latch for providing a latched signal;
a first driver coupled to the input line that drives the input signal to the transfer gate; and
a second driver coupled to the latch that drives a latched signal to the output line, wherein the second driver is comprised of a P-channel inverter with a width of 10 µm.

6. A random access memory chip comprising:
a plurality of input address lines for carrying address signals which specific a particular memory location;
an address decoder coupled to the address lines for decoding the address signals;
a memory array coupled to the address decoder for storing bits of data;
a read/write input line coupled to the memory array for specifying read or write operations to be performed on the memory array;
a plurality of data lines coupled to the memory array for inputting data signals to the memory array;
a plurality of output lines coupled to the memory array for outputting data;
a plurality of latches coupled to each of the input address lines, the read/write input line, the data lines, and the output lines, wherein all latches are comprised of:
an input line for accepting an input signal to the circuit;
a latch coupled to the input line for latching the input signal;
a transfer gate coupled to the input line and latch for transferring the input signal to the latch according to a clock signal;
a transistor coupled to the latch for decoupling a feedback loop associated with the latch according to the clock signal;
an output line coupled to the latch for outputting a latched signal.

7. A method for latching a signal to a circuit, comprising the steps of:
accepting an input signal;
storing the input signal in a latch;
transferring the input signal to the latch with a transfer gate that is controlled by a clock signal;
clocking the transfer gate and the latch;
decoupling of the transfer gate when the latch is activated by the clock signal;
driving the input signal with a first driver to the transfer gate;
driving a latched signal with a second driver to an output; and
selectively decoupling a feedback loop associated with the latch when the transfer rate is activated by the clock signal.

8. A circuit for latching comprising:
an input line;
a latch connected between the input line and an output line, the latch comprising:
a first inverter;
a second inverter coupled in series with the first inverter; and
a transistor, wherein one terminal of the transistor connects to an output of the second inverter, another terminal of the transistor connects to an input of the first inverter, the input line, and the output line, and a control terminal of the transistor receives a control signal; and a transfer gate connected between the input line and the latch, the transfer gate controlled by the control signal.

9. A circuit for latching a signal comprising:

an input line;

a latch connected between the input line and an output line, the latch comprising:

a first inverter;

a second inverter coupled in series with the first inverter; and a transistor, one terminal of the transistor being connected to an output of the second inverter, another terminal of the transistor being connected to an input of the first inverter, and a control terminal of the transistor decoupling a feedback path associated with the latch according to a control signal, wherein the first inverter, the second inverter, and the transistor are not located on a path between the input line and the output line; and a transfer gate between the input line and the latch for transferring the input signal to the latch according to the control signal.

* * * * *